United States Patent [19]

Ohnishi et al.

[11] Patent Number: 5,440,195
[45] Date of Patent: Aug. 8, 1995

[54] PIEZOELECTRIC CERAMIC TRANSFORMER

[75] Inventors: Osamu Ohnishi; Takeshi Inoue, both of Tokyo, Japan

[73] Assignee: NEC Corporation, Tokyo, Japan

[21] Appl. No.: 187,501

[22] Filed: Jan. 28, 1994

[30] Foreign Application Priority Data

Jan. 28, 1993 [JP] Japan ............ 5-012186

[51] Int. Cl.$^6$ ............................................ H01L 41/08
[52] U.S. Cl. ................................. 310/359; 310/320; 310/366
[58] Field of Search ................. 310/320, 359, 366

[56] References Cited

U.S. PATENT DOCUMENTS

| | | | |
|---|---|---|---|
| 2,953,755 | 9/1960 | Mattiat | 310/359 |
| 3,271,622 | 9/1966 | Malagodi et al. | 310/316 |
| 3,707,636 | 12/1972 | Inoue | 310/359 |
| 4,431,935 | 2/1984 | Rider | 310/366 |
| 4,459,505 | 7/1984 | Lim | 310/318 |
| 4,564,782 | 1/1986 | Ogawa | 310/359 |
| 5,118,982 | 6/1992 | Inoue et al. | 310/366 |
| 5,278,471 | 1/1994 | Uehara et al. | 310/366 |

FOREIGN PATENT DOCUMENTS

| | | | |
|---|---|---|---|
| 3321435 | 12/1984 | Germany | 310/359 |
| 14167504 | 6/1992 | Japan | 310/359 |

OTHER PUBLICATIONS

"Piezoelectric Transformers Using Single Crystals of LiNbO$_3$" by Nakamura and Adachi, Oct. 18, 1990, pp. 15–19 w/English abstract.

"Ceramic Transformers and Filters" May 1956, pp. 205–211.

"Piezoelectric Transformer Using Energy Trapping of Width-Shear Vibration in LiNbO$_3$ Plate" by M. Ueda et al., 1992 Ultrasonics Symposium, pp. 977–980.

*Primary Examiner*—Thomas M. Dougherty
*Attorney, Agent, or Firm*—Sughrue, Mion, Zinn, Macpeak & Seas

[57] ABSTRACT

A piezoelectric ceramic transformer includes a piezoelectric plate, a pair of driving sections, and a power generating section. The piezoelectric plate is made of a piezoelectric ceramic material and has a long plate-like structure. The pair of driving sections are arranged at two end portions of the piezoelectric plate and formed by alternately stacking a plurality of piezoelectric ceramic layers polarized in a direction of thickness of the piezoelectric plate and first internal electrodes, and cause longitudinal vibration by a driving voltage applied to first and second input terminals. The power generating section is arranged at a central portion of the piezoelectric plate in a lengthwise direction thereof and polarized in the lengthwise direction of the piezoelectric plate, and generates an output voltage at a first output terminal by the longitudinal vibration transmitted from the driving sections.

12 Claims, 5 Drawing Sheets

PIEZOELECTRIC CERAMIC TRANSFORMER

BACKGROUND OF THE INVENTION

The present invention relates to a piezoelectric ceramic transformer which can be operated by various types of high-voltage generating power supply circuits and, more particularly, to a compact, low-profile piezoelectric ceramic transformer which requires size reduction and a high reliability and generates a high voltage.

Conventionally, in a power supply circuit of a unit, e.g., a deflector of a television set or a charging unit of a copying machine, which requires a high voltage, a winding type electromagnetic transformer has been used as a transforming element for generating a high voltage. This electromagnetic transformer has a structure in which a conductive wire is wound on a magnetic core. In order to realize a high transforming ratio, the number of turns of the wound conductive wire must be increased. Therefore, it is very difficult to realize a compact, low-profile electromagnetic transformer.

Figure 7:
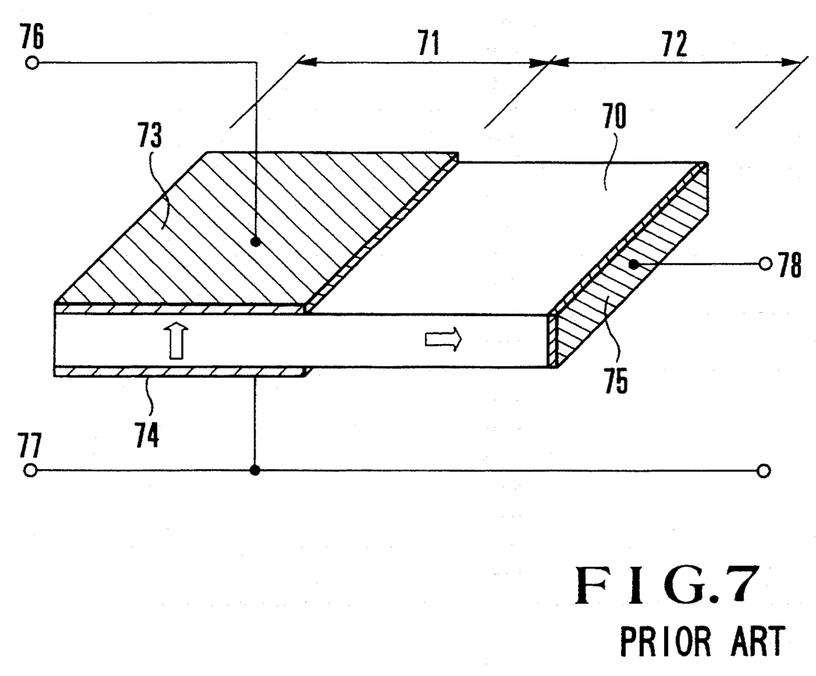
FIG. 7 is a perspective view of a conventional Rosen piezoelectric transformer.

Meanwhile, a piezoelectric transformer using a piezoelectric effect is proposed. FIG. 7 shows the structure of a Rosen piezoelectric transformer as a typical conventional piezoelectric transformer. This piezoelectric transformer will be described with reference to FIG. 7. Assume a case wherein a high voltage is to be obtained. In a piezoelectric plate 70 having electrodes 73 to 75 formed on its surface, a portion indicated by reference numeral 71 is a low-impedance driving section of the piezoelectric transformer. The driving electrodes 73 and 74 are formed on the upper and lower surfaces of the piezoelectric plate 70 corresponding to the driving section 71. The driving section 71 is polarized in the direction of thickness, as indicated by an arrow in FIG. 7. Similarly, a portion of the piezoelectric plate 70 indicated by reference numeral 72 is a high-impedance power generating section. The output electrode 75 is formed on the end face of the piezoelectric plate 70 corresponding to the power generating section 72. The power generating section 72 is polarized in the lengthwise direction of the piezoelectric plate 70, as indicated by an arrow in FIG. 7. This piezoelectric transformer operates as follows. When a voltage is applied to the driving electrodes 73 and 74 from external terminals 76 and 77, an electric field is applied to the driving section 71 in the polarizing direction. The piezoelectric plate 70 is vertically vibrated in the lengthwise direction in accordance with a piezoelectric effect (to be referred to as the piezoelectric transverse effect 31 mode hereinafter) wherein displacement occurs in a direction perpendicular to the polarizing direction, so that the entire transformer vibrates. In the power generating section 72, a voltage having the same frequency as that of the input voltage is derived at an external terminal 78 through the output electrode 75 in accordance with a piezoelectric effect (to be referred to as the piezoelectric longitudinal effect 33 mode hereinafter) wherein a potential difference occurs in the polarizing direction due to the mechanical strain in the polarizing direction. At this time, if the driving frequency is set to be the same as the resonant frequency of the piezoelectric transformer, a very high output voltage can be obtained. To obtain a low-voltage output upon inputting a high voltage, it is apparent that the high-impedance power generating section 72 of the longitudinal effect may be set as the input side and the low-impedance driving section 71 of the transverse effect may be set as the output side.

This piezoelectric transformer is used in the resonant state and has numerous advantages as compared to an ordinary electromagnetic transformer, such that: (1) downsizing and profile reduction can be performed since a winding structure is not needed and the energy density is high; (2) the entire structure can be made inflammable; and (3) noise due to electromagnetic induction does not occur.

However, the conventional Rosen piezoelectric transformer has drawbacks. For example, since the electrode of the power generating section is located on the loop of vibration, i.e., in the vibrating direction, connection of the external terminals adversely affects vibration or largely degrades reliability. Also, although a comparatively high output voltage can be obtained when the load resistance is extremely higher than the impedance of the piezoelectric transformer, a very high output voltage cannot be obtained when the load resistance is not much high.

SUMMARY OF THE INVENTION

It is an object of the present invention to provide a piezoelectric ceramic transformer having a higher reliability by eliminating an adverse effect to vibration caused by connection of external terminals.

It is another object of the present invention to provide a piezoelectric ceramic transformer capable of obtaining a high output voltage even when an added resistance is low.

In order to achieve the above objects, according to the present invention, there is provided a piezoelectric ceramic transformer comprising a piezoelectric plate made of a piezoelectric ceramic material and having a long plate-like structure, a pair of driving sections, arranged at two end portions of the piezoelectric plate and formed by alternately stacking a plurality of piezoelectric ceramic layers polarized in a direction of thickness of the piezoelectric plate and first internal electrodes, for causing longitudinal vibration by a driving voltage applied to first and second input terminals, and a power generating section, arranged at a central portion of the piezoelectric plate in a lengthwise direction thereof and polarized in the lengthwise direction of the piezoelectric plate, for generating an output voltage at a first output terminal by the longitudinal vibration transmitted from the driving sections.

DESCRIPTION OF THE PREFERRED EMBODIMENTS

Figure 1A:
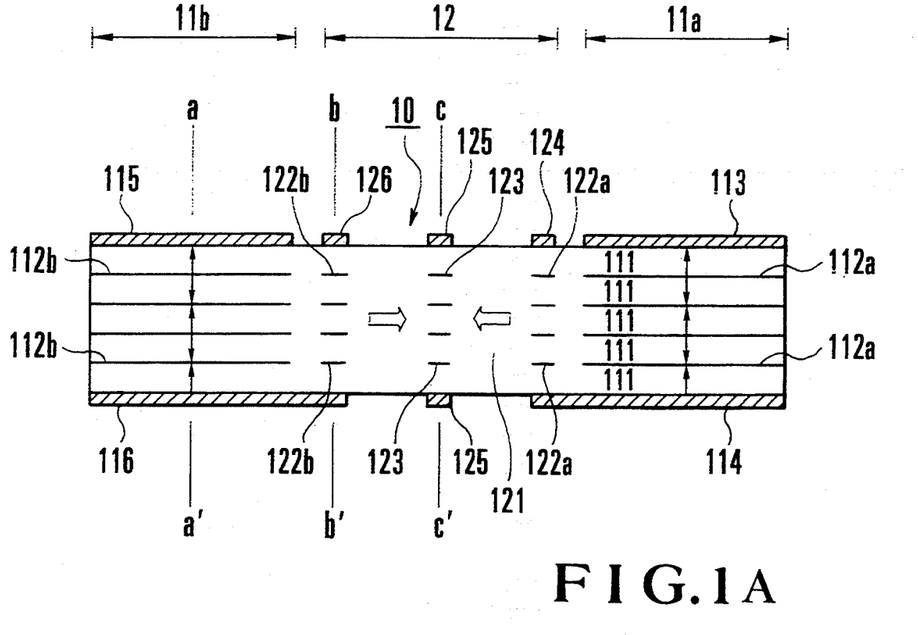
FIG. 1A is a longitudinal sectional view showing a piezoelectric ceramic transformer according to an embodiment of the present invention.
Figure 1B:
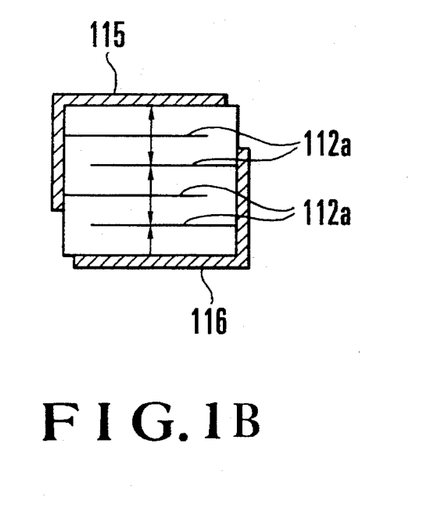
FIG. 1B is a sectional view taken along the line a–a' of FIG. 1A.
Figure 1C:
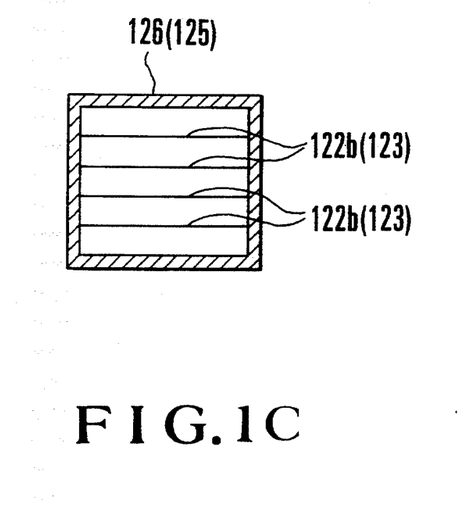
FIG. 1C is a sectional view taken along the line b–b' or c–c' of FIG. 1A.

The present invention will be described with reference to the accompanying drawings. FIG. 1A shows a piezoelectric ceramic transformer taken along a direction perpendicular to the widthwise direction according to an embodiment of the present invention. FIG. 1B shows the piezoelectric ceramic transformer shown in FIG. 1A along a direction perpendicular to the longitudinal direction, i.e., along the line a-a' of FIG. 1A. FIG. 1C shows the piezoelectric ceramic transformer shown in FIG. 1A along the direction perpendicular to the longitudinal direction, i.e., along the line b-b' or c-c' of FIG. 1A. Referring to FIG. 1A, reference numeral 10 denotes a piezoelectric plate made of a piezoelectric material and forming a long plate. A pair of driving sections 11a and 11b are arranged at the two ends of the piezoelectric plate 10 in the lengthwise direction, and a power generating section 12 is arranged at the central portion of the piezoelectric plate 10. In the driving sections 11a and 11b, piezoelectric ceramic layers 111 polarized in the direction of thickness are arranged to sandwich internal electrodes 112a and 112b, respectively, such that the polarizing directions are opposite to each other. As shown in FIG. 1B, every other internal electrodes 112a or 112b are connected to external electrodes 113 and 114, or 115 and 116, respectively, on the surface of the piezoelectric plate 10. Since the number of piezoelectric ceramic layers 111 is five, which is an odd number, in FIG. 1B, the external electrode 113 is arranged on the upper major surface and the left side surface of the piezoelectric plate 10, and the external electrode 114 is arranged on the lower major surface and the right side surface of the piezoelectric plate 10. However, if the number of piezoelectric ceramic layers 111 is an even number, either one of the external electrodes 113 and 114 is arranged on one side surface and the two major surfaces, and the remaining external electrode 114 or 113 is arranged on only one remaining side surface.

A piezoelectric ceramic 121 at the power generating section 12 is polarized in the lengthwise direction. Comparatively thin internal electrodes 122a and 122b and surface external electrodes 124 and 126 are arranged on the two sides of the piezoelectric ceramic 121 in the widthwise direction. Internal electrodes 123 and an external electrode 125 are arranged at the central portion of the piezoelectric ceramic transformer in the longitudinal direction. The polarizing directions among the internal electrodes 123 are opposite to each other. The internal electrodes 122a, 123, and 122b are connected to each other through the external electrodes 124, 125, and 126, respectively. As shown in FIG. 1C, the external electrodes 124 to 126 are formed annularly to surround the piezoelectric ceramic transformer, and the external electrodes 124 and 126 are commonly connected to the external electrodes 114 and 116 on the lower major surface of the piezoelectric ceramic transformer. Accordingly, the external electrode 124 is connected to the external electrodes 114 and 116 of the driving sections 11a and 11b to serve as an equipotential electrode, while an output terminal is derived from the external electrode 125.

When a voltage is applied across the external electrodes 113 and 114 and 115 and 116 of the driving sections 11a and 11b of this piezoelectric ceramic transformer, longitudinal vibration in the lengthwise direction of the piezoelectric ceramic transformer occurs in accordance with the piezoelectric transverse effect 31 mode through an electromechanical coupling coefficient $k_{31}$. This longitudinal vibration is transmitted to the power generating section 12 to generate a voltage by the piezoelectric longitudinal effect 33 mode through an electromechanical coupling coefficient $k_{33}$, and this voltage is derived from the external electrode 125. If the frequency of the applied voltage is equal to the resonant frequency of the longitudinal vibration of the piezoelectric ceramic transformer, a comparatively high output voltage can be obtained.

Figure 2A:
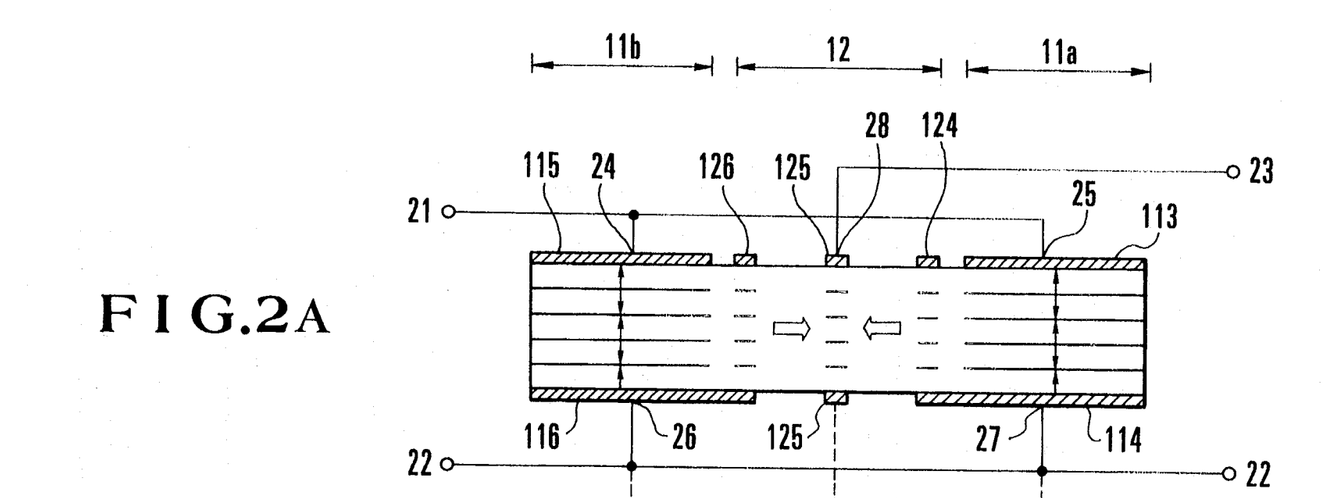
FIG. 2A is a diagram showing connection of the piezoelectric ceramic transformer shown in FIG. 1A.
Figure 2B:
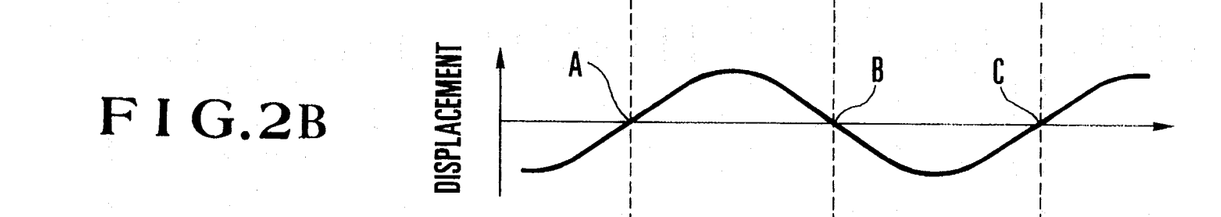
FIG. 2B is a chart showing the displacement distribution of this piezoelectric ceramic transformer.
Figure 2C:
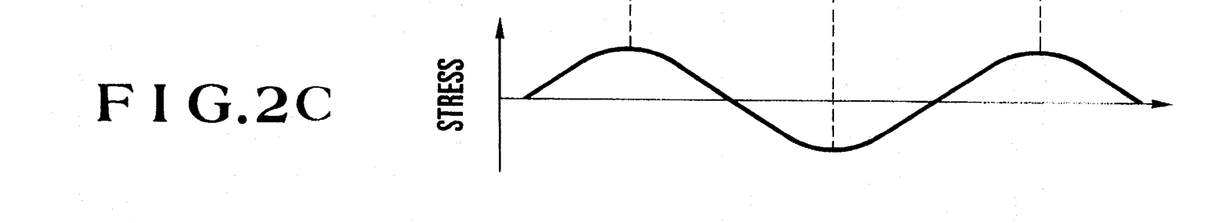
FIG. 2C is a chart showing the stress distribution of this piezoelectric ceramic transformer.

How to derive external terminals effectively for this piezoelectric ceramic transformer will be described. FIG. 2A shows connection of external terminals, and FIGS. 2B and 2C show displacement distribution and stress distribution, respectively, of the longitudinal vibration mode of third order. Referring to FIG. 2A, an input terminal 21 is connected to the external electrodes 115 and 113 of the driving sections 11a and 11b at connecting points 24 and 25, respectively. Common input/output terminals 22 are connected to the external electrodes 116 and 114 at connecting points 26 and 27. An output terminal 23 is connected to the external electrode 125 of the power generating section 12 at a connecting point 28.

The longitudinal vibration mode of third order is a vibration mode in which the 3/2 wavelength of the longitudinal vibration is equal to the length of the entire piezoelectric ceramic transformer, and nodes A, B, and C of vibration exist at three positions, as shown in the displacement distribution of FIG. 2B. Of these nodes, the nodes A and C are located at positions $\frac{1}{4}$-wavelength inside the two ends of the piezoelectric ceramic transformer. The node B is the center of the entire piezoelectric ceramic transformer. When the positions of the nodes and the connecting points are compared, the connecting points 24 and 26 can be arranged at the node A, the connecting points 25 and 27 can be arranged at the node C, and the connecting point 28 can be arranged at the node B. In this manner, in the piezoelectric ceramic transformer having the structure according to the present invention, since all the electric terminals can be derived from the nodes of vibration, good vibration characteristics and a high reliability can be realized. As shown in the stress distribution of FIG. 2C, the stress becomes maximum at a portion of the piezoelectric ceramic transformer where a displacement is zero.

Figure 3:
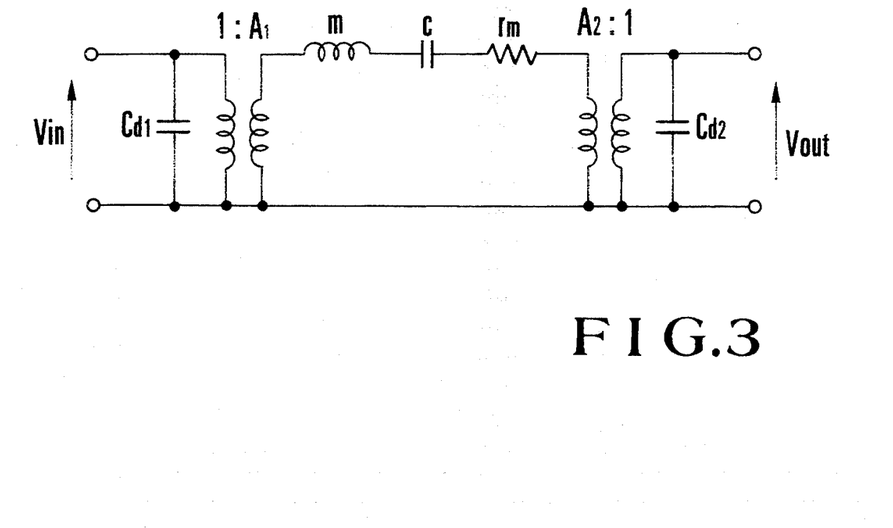
FIG. 3 is an equivalent circuit diagram of a lumped constant circuit of the piezoelectric ceramic transformer shown in FIG. 1A.

The approximately equivalent circuit of the lumped constant in the vicinity of the resonant frequency of this piezoelectric ceramic transformer is shown in FIG. 3, in the same manner as other piezoelectric transformers. Referring to FIG. 3, reference symbols $C_{d1}$ and $C_{d2}$ indicate the damping capacitors of the input and output sides, respectively; $A_1$ and $A_2$, the input and output force factors, respectively; and m, c, and $r_m$, the equivalent mass, the equivalent compliance, and the equivalent mechanical resistor, respectively, concerning the longitudinal vibration mode of third order. The input and output force factors $A_1$ and $A_2$ of the piezoelectric ceramic transformer of the present invention are expressed by the following equations:

$$A_1 = w \cdot (\epsilon_{33}^T/S_{11}^E)^{0.5} \cdot k_{31} \cdot n \quad (1)$$

$$A_2 = w \cdot t/l_2 \cdot (\epsilon_{33}^T/S_{33}^E)^{0.5} \cdot k_{33} \quad (2)$$

where w is the width, t is the entire thickness, $l_2$ is half the length of the power generating section, $\epsilon$ is the dielectric constant, s is the elastic compliance, and k is the electromechanical coupling coefficient.

As is apparent from the equivalent circuit of FIG. 3, generally, an output voltage Vout of a piezoelectric transformer changes in accordance with the resistance of a connected load, and the larger the load resistance, the larger Vout. However, in a high-voltage, high-power application, the resistance of the load is not very high, and the output voltage Vout tends to be as very low as a fraction or less of a value obtained when the output terminals are open. In contrast to this, in the piezoelectric ceramic transformer according to the present invention, since the driving sections are constituted by n piezoelectric ceramic layers, the force factor $A_1$ indicated in equation (1) is increased in proportion to the number n of layers. Accordingly, an output voltage of about n times that obtained with a piezoelectric transformer not having a multilayered structure can be obtained, and a sufficiently high voltage can be applied even with a comparatively low load resistance.

In the piezoelectric ceramic transformer according to the present invention, since the internal electrodes 122a, 122b, and 123 are arranged in the power generating section 12 as shown in FIG. 1A, the strain in lines of electric field in the power generating section 12 upon polarization is small as compared to a case wherein only the external electrodes 124 to 126 are arranged, and the lines of electric field become substantially parallel to the lengthwise direction. Therefore, polarizing directions in the piezoelectric ceramic layers of the power generating section 12 are aligned in the lengthwise direction, so that the electromechanical coupling coefficient $k_{33}$ can be increased up to about the limit of the material.

EXAMPLE 1

As Example 1 of the piezoelectric ceramic transformer of the present invention, a piezoelectric ceramic transformer having the structure shown in FIG. 1 was fabricated in accordance with the green sheet method. A PZT (PbZrO$_3$-PbTiO$_3$) piezoelectric ceramic was used as the piezoelectric ceramic. Internal electrodes 112a, 112b, 122a, 122b, and 123 were formed by screen-printing a Pt paste on the green sheet of the piezoelectric material and calcining the Pt paste together with the piezoelectric material. Although the PZT piezoelectric ceramic and Pt were used as the materials of the piezoelectric ceramic and the internal electrodes in this case, the piezoelectric ceramic transformer having other combinations can operate, as a matter of course, as far as a piezoelectric ceramic material having piezoelectric properties and an electrode material that can be calcined together with this piezoelectric ceramic material are used. In both the driving sections and the power generating section, the electrode portions had five piezoelectric ceramic layers and four internal electrode layers. The thickness of each piezoelectric ceramic layer was set to 0.2 mm, and the entire thickness was set to 1 mm. After calcination, the obtained structure was cut into a size of 30 mm in length and 5 mm in width. An Ag paste was coated on this structure, and the resultant structure was calcined, thereby forming external electrodes 113, 114, 115, 116, 124, 125, and 126. These external electrodes can be formed in accordance with methods other than coating and calcination. For example, the sputtering method may be employed as the deposition method to form a thin film made of a conductive material other than Ag. Thereafter, polarization was performed by applying a voltage of 4 kV/mm in an insulating oil at 100° C. Furthermore, lead wires were connected by using a solder, as shown in FIG. 2A. At this time, connecting points 24, 25, 26, and 27 of the power generating section were set at positions inside the two ends of the piezoelectric ceramic transformer by 5 mm.

The resonant frequency of the longitudinal vibration mode of third order of this piezoelectric ceramic transformer was measured to be 153 kHz from the frequency characteristics of the admittance. When a 200-kΩ load resistor, which was a resistor having a comparatively low resistance as an application for a high voltage, was connected to this piezoelectric ceramic transformer, an output voltage of 650 V was obtained for an input voltage of 10 V. An output power at this time was 2.1 W.

One hundred piezoelectric ceramic transformers each prepared in the above manner were continuously driven for 2,000 hours. No sample showed separation of an external electrode or abnormality in characteristics.

Figure 4:
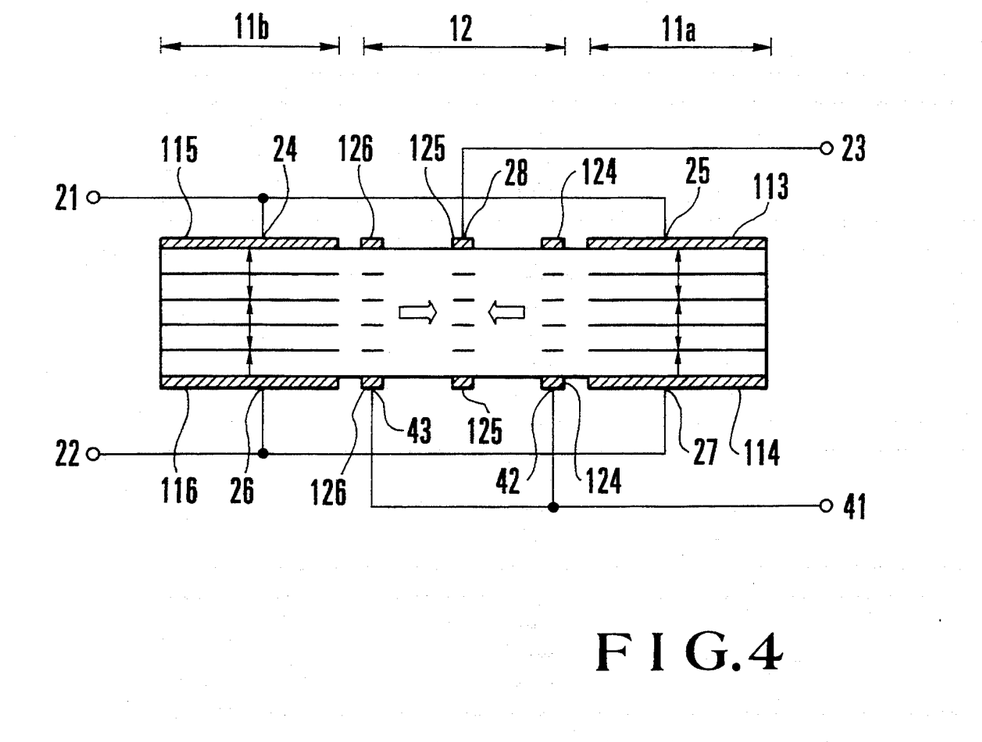
FIG. 4 is a diagram showing connection of an example of a piezoelectric transformer having a four-terminal structure.

This piezoelectric ceramic transformer can also be used as a four-terminal transforming element, as shown in FIG. 4. More specifically, an output terminal 41 may be connected to external electrodes 124 and 126 on the outer surface of a power generating section through connecting points 42 and 43. Although the connecting points 42 and 43 are not located at the nodes of the longitudinal vibration mode of third order, with this terminal structure, input terminals 21 and 22, and an output terminal 23 and the output terminal 41 are completely insulated from each other in the DC manner. Accordingly, the degree of freedom in circuit design when applying to a power supply circuit is increased. In FIG. 4, the same portions as in FIG. 2A are denoted by the same reference numerals, and a detailed description thereof will be omitted.

EXAMPLE 2

Figure 5A:
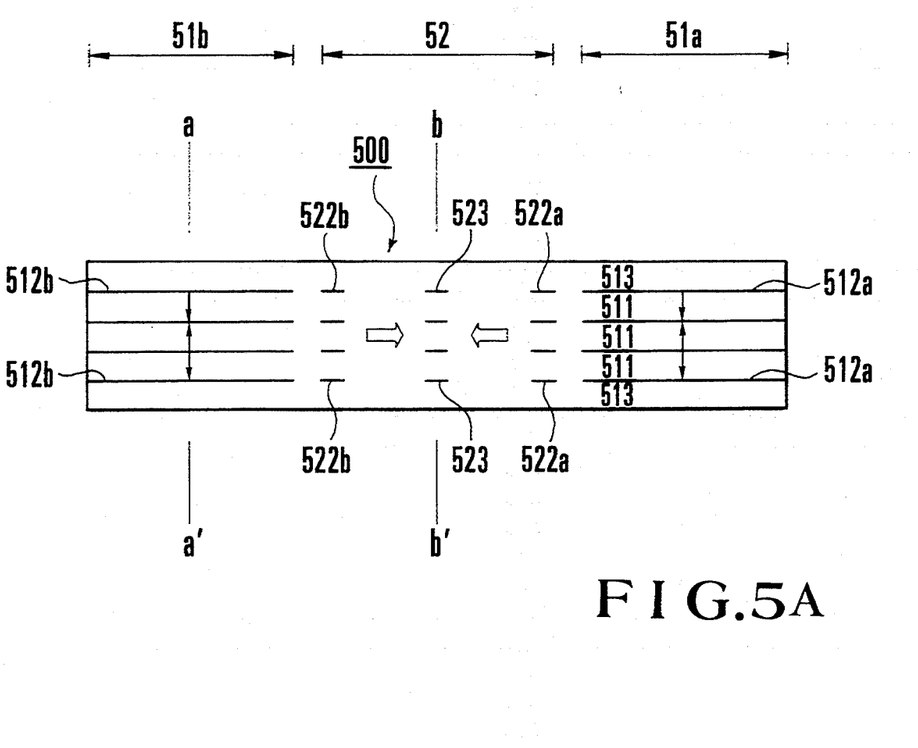
FIG. 5A is a longitudinal sectional view of a piezoelectric ceramic transformer having no electrodes on its upper and lower surfaces.
Figure 5B:
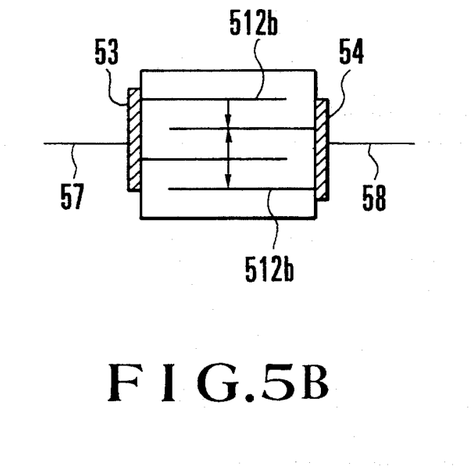
FIG. 5B is a sectional view taken along the line a-a' of FIG. 5A.
Figure 5C:
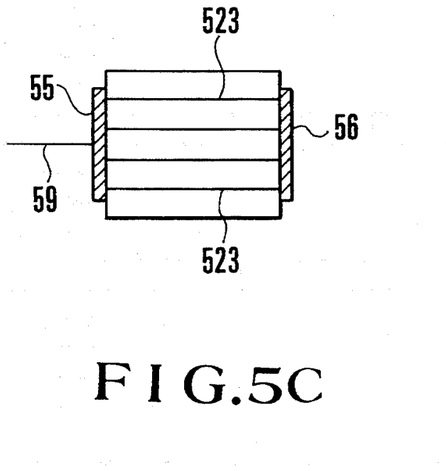
FIG. 5C is a sectional view taken along the line b-b' of FIG. 5A.

A piezoelectric ceramic transformer having no external terminals on its upper and lower major surfaces was fabricated. FIGS. 5A to 5C show the structure of this piezoelectric ceramic transformer. FIG. 5A shows the transformer taken along a direction perpendicular to the widthwise direction, and FIGS. 5B and 5C show the transformer taken along the lines a-a' and b-b', respectively, of FIG. 5A. In driving sections 51a and 51b arranged at the two ends of a piezoelectric plate 500 of this piezoelectric ceramic transformer, inactive layers 513 made of the piezoelectric ceramic are arranged on and under a structure constituted by three piezoelectric ceramic layers 511 and four internal electrodes 512a or 512b. As shown in FIG. 5B, the internal electrodes 512a and 512b arranged in the central portion of the piezoelectric plate 500 in the lengthwise direction are respectively connected to external terminals 57 and 58 through external electrodes 53 and 54 arranged on the side portions of the piezoelectric ceramic transformer. It is preferable that the connecting points for connecting the external electrodes 53 and 54 to the external terminals 57 and 58 are arranged at the nodes of vibration, as has been described with reference to FIG. 2B. In a power generating section 52, as shown in FIG. 5C, internal electrodes 523 are connected to an output terminal 59 through external electrodes 55 and 56 arranged on the side portions of the piezoelectric ceramic transformer. In this case, the external electrode 56 is not always necessary. Internal electrodes 522a and 522b are similarly connected to external terminals through external electrodes (not shown) arranged on the side portions of the piezoelectric ceramic transformer. These external electrodes (not shown) are connected to either one of the external electrodes 53 and 54 of the driving sections 51a and 51b. The operating principle and the like of this piezoelectric ceramic transformer are the same as that of the above example. Although the power to be dealt with is decreased by a decrease in proportion of the active layer, since no electrodes are arranged on the upper and lower major surfaces, this structure can be supported by, e.g., vertically clamping it at the nodes of vibration with metal conductors. When a 200-kΩ load resistor was connected to an actually fabricated piezoelectric ceramic transformer, an output voltage of 510 V, i.e., an output power of 1.3 W was obtained for an input voltage of 10 V.

EXAMPLE 3

Figure 6:
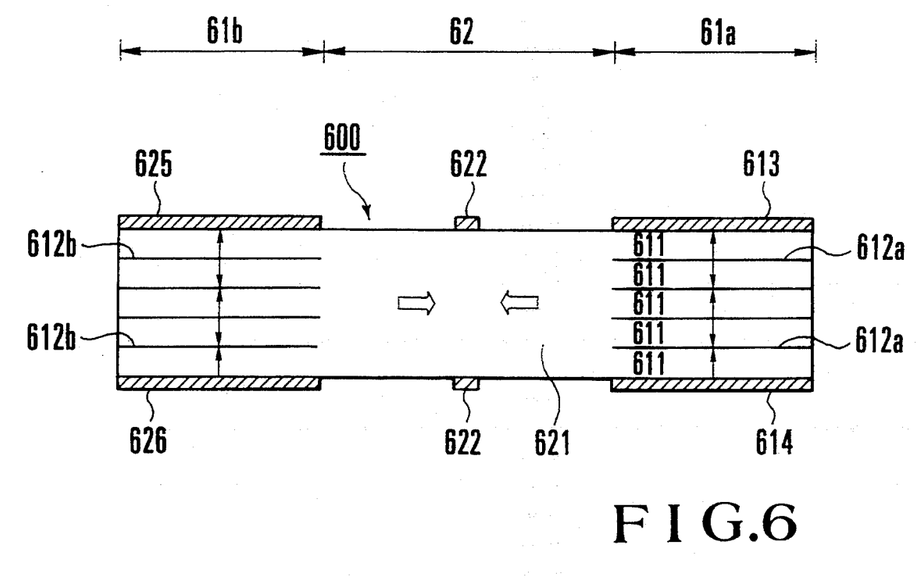
FIG. 6 is a longitudinal sectional view of a piezoelectric ceramic transformer having no internal electrodes in its power generating section.

A piezoelectric ceramic transformer having no internal electrodes in its power generating section was fabricated. FIG. 6 shows this transformer taken along a direction perpendicular to the widthwise direction. Driving sections 61a and 61b have completely the same structure as those of Example 1. A power generating section 62 is constituted by only a piezoelectric ceramic 621 polarized in the lengthwise direction of a piezoelectric plate 600 and an external electrode 622. Three external terminals are respectively connected to external terminals 613 and 625, 614 and 626, and 622, respectively. In order to provide four external terminals, an external electrode (corresponding to the external electrode 124 of FIG. 1A) may be provided at a portion comparatively on the outer side of the power generating section 62. In this example, since the power generating section 62 does not have internal electrodes, even when a voltage is applied to the external electrodes 613, 614, 625, and 626 during polarization, the lines of electric force are not completely aligned in the lengthwise direction, so that the efficiency is more or less degraded. However, when the length of the power generating section 62 is sufficiently larger than the thickness of the piezoelectric ceramic transformer, the degradation in efficiency is not very large. When a 330-kΩ load resistor was connected to an actually fabricated piezoelectric ceramic transformer, an output voltage of 680 V, i.e., an output power of 1.4 W was obtained for an input voltage of 10 V.

As has been described above in detail, the piezoelectric ceramic transformer with the structure according to the present invention has high-voltage, high-power characteristics, and high reliability while being a compact, low-profile transformer, which have advantages that cannot be obtained with a conventional piezoelectric transformer. Therefore, the piezoelectric ceramic transformer of the present invention has many industrial advantages.

What is claimed is:
1. A piezoelectric ceramic transformer comprising:

a piezoelectric plate made of a piezoelectric ceramic material and having a long plate-like structure;

a pair of driving sections, arranged at two end portions of said piezoelectric plate and formed by alternately stacking a plurality of piezoelectric ceramic layers polarized in a direction of thickness of said piezoelectric plate and first internal electrodes, for causing longitudinal vibration by a driving voltage applied to first and second input terminals; and a power generating section, arranged at a central portion of said piezoelectric plate in a lengthwise direction thereof and polarized in the lengthwise direction of said piezoelectric plate, for generating an output voltage at a first output terminal by the longitudinal vibration transmitted from said driving sections.

2. A transformer according to claim 1, further comprising:

first external electrodes formed at least on a first major surface of said piezoelectric plate to correspond to said respective driving sections and connected to every other ones of said first internal electrodes and to said first input terminal; and second external electrodes formed at least on a second major surface of said piezoelectric plate to correspond to said respective driving sections and connected to remaining ones of said first internal electrodes and to said second input terminal.

3. A transformer according to claim 2, wherein said first and second external electrodes are connected to said first and second input terminals through nodes where the longitudinal vibration caused by said driving sections does not displace.

4. A transformer according to claim 3, wherein, when a driving mode is a longitudinal vibration mode of third order, said second external electrodes are connected to said second input terminal at portions inside said two end portions of said piezoelectric plate by ¼ the wavelength of the longitudinal vibration mode of third order.

5. A transformer according to claim 1, further comprising:

a plurality of second internal electrodes formed by stacking at said central portion of said piezoelectric plate in the lengthwise direction and electrically connected to said first output terminal; and a plurality of pairs of third internal electrodes, formed by stacking in said piezoelectric plate at two end portions of said power generating section in the lengthwise direction to respectively oppose said second internal electrodes, and electrically connected to said second input terminal.

6. A transformer according to claim 5, wherein said first internal electrodes of said power generating section are formed in n layers, and said second and third internal electrodes are formed in n layers to oppose said first internal electrodes in the lengthwise direction of said piezoelectric plate.

7. A transformer according to claim 5, further comprising external electrode formed at said central portion of said piezoelectric plate in the lengthwise direction of at least said first major surface and connected to said second internal electrode and to said first output terminal at a node where the longitudinal vibration caused by said driving sections does not displace.

8. A transformer according to claim 5, further comprising external electrodes formed at least on one surface of said piezoelectric plate and connected to said respective third internal electrodes and to said second input terminal.

9. A transformer according to claim 5, further comprising external electrodes formed at least on one surface of said piezoelectric plate and connected to said respective third internal electrodes and to a second output terminal.

10. A transformer according to claim 1, further comprising:
a first external electrode formed on one side surface of said piezoelectric plate to correspond to said respective driving sections and connected to every other ones of said first internal electrodes and to said first input terminal;
a second external electrode formed on the other side surface of said piezoelectric plate to correspond to said respective driving sections and connected to remaining ones of said first internal electrodes and to said second input terminal;
a plurality of second internal electrodes formed by stacking in said piezoelectric plate at said central portion of said piezoelectric plate in the lengthwise direction thereof;
a plurality of pairs of third internal electrodes formed by stacking in said piezoelectric plate at two ends of said power generating section in the lengthwise direction of said piezoelectric plate to respectively oppose said second internal electrodes in the lengthwise direction of said piezoelectric plate; and
third external electrodes formed on side surfaces of said piezoelectric plate and connected to said second internal electrodes and to said first output terminal.

11. A transformer according to claim 10, wherein inactive layers made of a piezoelectric ceramic are formed on uppermost and lowermost ones of said piezoelectric ceramic layers of each of said driving sections.

12. A transformer according to claim 1, further comprising external electrode formed at a central portion of at least a first major surface of said piezoelectric plate in the lengthwise direction of said piezoelectric plate and connected to said first output terminal.

* * * * *